United States Patent
Yu et al.

(10) Patent No.: US 12,237,216 B2
(45) Date of Patent: Feb. 25, 2025

(54) METHOD FOR FILLING RECESSED FEATURES IN SEMICONDUCTOR DEVICES WITH A LOW-RESISTIVITY METAL

(71) Applicant: Tokyo Electron Limited, Tokyo (JP)

(72) Inventors: Kai-Hung Yu, Albany, NY (US); Shihsheng Chang, Albany, NY (US); Ying Trickett, Albany, NY (US); Eric Chih-Fang Liu, Albany, NY (US); Yun Han, Albany, NY (US); Henan Zhang, Albany, NY (US); Cory Wajda, Albany, NY (US); Robert D. Clark, Albany, NY (US); Gerrit J. Leusink, Albany, NY (US); Gyanaranjan Pattanaik, Albany, NY (US); Hiroaki Niimi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 299 days.

(21) Appl. No.: 17/688,343

(22) Filed: Mar. 7, 2022

(65) Prior Publication Data
US 2022/0301930 A1   Sep. 22, 2022

Related U.S. Application Data

(60) Provisional application No. 63/161,909, filed on Mar. 16, 2021.

(51) Int. Cl.
*H01L 21/768*   (2006.01)

(52) U.S. Cl.
CPC .. *H01L 21/76846* (2013.01); *H01L 21/76826* (2013.01); *H01L 21/76871* (2013.01); *H01L 21/76879* (2013.01)

(58) Field of Classification Search
CPC ........ H01L 21/76846; H01L 21/76826; H01L 21/76871; H01L 21/76879; H01L 21/76831; H01L 21/76877; H01L 21/76814; H01L 23/53252; H01L 23/485
See application file for complete search history.

(56) References Cited

U.S. PATENT DOCUMENTS

| | | | |
|---|---|---|---|
| 8,945,305 B2 * | 2/2015 | Marsh | H01L 21/02175 438/758 |
| 2012/0164826 A1 * | 6/2012 | Matsuda | H01L 21/3105 438/653 |

(Continued)

OTHER PUBLICATIONS

Korean Intellectual Property Office, International Search Report and Written Opinion for International application No. PCT/US2022/019152, mailed Jun. 21, 2022, 11pp.

*Primary Examiner* — Dale E Page
*Assistant Examiner* — Quovaunda Jefferson

(57) ABSTRACT

A method for filling recessed features with a low-resistivity metal. The method includes providing a patterned substrate containing a recessed feature formed in a first layer and a second layer that is exposed in the recessed feature, forming a nucleation enhancement layer on a sidewall of the first layer in the recessed feature and depositing a metal layer in the recessed feature by vapor phase deposition, where the metal layer is deposited on the second layer and on the nucleation enhancement layer. An initial metal layer may be selectively formed on the second layer in the recessed feature before forming the nucleation enhancement layer.

21 Claims, 9 Drawing Sheets

(56) References Cited

U.S. PATENT DOCUMENTS

| | | | |
|---|---|---|---|
| 2016/0049328 A1* | 2/2016 | Zhou | H01L 23/53238 |
| | | | 257/751 |
| 2016/0181149 A1* | 6/2016 | Deng | H01L 21/3105 |
| | | | 438/618 |
| 2018/0006140 A1 | 1/2018 | Fronheiser et al. | |
| 2019/0067087 A1 | 2/2019 | Briggs et al. | |
| 2019/0164887 A1* | 5/2019 | Wang | H01L 23/5283 |
| 2020/0006127 A1* | 1/2020 | Khaderbad | H01L 29/66795 |
| 2020/0098623 A1* | 3/2020 | Cheng | H01L 21/2855 |
| 2020/0118871 A1* | 4/2020 | Yu | H01L 21/76831 |

* cited by examiner

METHOD FOR FILLING RECESSED FEATURES IN SEMICONDUCTOR DEVICES WITH A LOW-RESISTIVITY METAL

CROSS REFERENCE TO RELATED APPLICATIONS

This application claims priority to and the benefit of the filing date of U.S. Provisional Patent Application No. 63/161,909, filed Mar. 16, 2021, which application is incorporated herein by reference in its entirety.

FIELD OF THE INVENTION

The present invention relates to semiconductor processing and semiconductor devices, and more particularly, to a method for filling recessed features in semiconductor devices with a low-resistivity metal.

BACKGROUND OF THE INVENTION

Semiconductor devices contain filled recessed features that include trenches and vias that are formed in a dielectric material such as an interlayer dielectric (ILD). During metal chemical vapor deposition (CVD), metal nucleation on dielectric materials is usually poor. This problem can be addressed by depositing a liner such as TiN or TaN with a thickness of 1-1.5 nm in the recessed features prior to the metal CVD. The liner provides a good nucleation surface and good adhesion to the metal, but the presence of the liner reduces the amount of metal that can be deposited in the recessed features and also results in a high electrical resistance layer at the bottom of the recessed features. Therefore, new methods are needed for void-free metal filling of recessed features that further reduce the thickness of the liner or do not require the use of a liner.

SUMMARY OF THE INVENTION

Embodiments of the invention describe a method of filling recessed features in semiconductor devices with a low-resistivity metal. According to one embodiment, the method includes providing a patterned substrate containing a recessed feature formed in a first layer and a second layer that is exposed in the recessed feature, forming a nucleation enhancement layer on a sidewall of the first layer in the recessed feature and depositing a metal layer in the recessed feature by vapor phase deposition, where the metal layer is deposited on the second layer and on the nucleation enhancement layer.

According to another embodiment, the method includes providing a patterned substrate containing a recessed feature formed in a first layer and a second layer that is exposed in the recessed feature, selectively forming an initial metal layer on the second layer in the recessed feature, thereafter, forming a nucleation enhancement layer on a sidewall of the first layer in the recessed feature, and depositing a metal layer in the recessed feature by vapor phase deposition, where the metal layer is deposited on the initial metal layer and on the nucleation enhancement layer.

According to another embodiment, the method includes providing a patterned substrate containing a recessed feature formed in a dielectric material and a second layer that is exposed in the recessed feature, depositing a contact metal on the dielectric material and on the second layer, where the contact metal reacts to form a metal oxide layer on the dielectric material, removing the metal oxide layer from a sidewall of the dielectric material in the recessed feature, forming a nucleation enhancement layer on the sidewall, and depositing a metal layer in the recessed feature by vapor phase deposition, where the metal layer is deposited on the contact metal and on the nucleation enhancement layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1A:
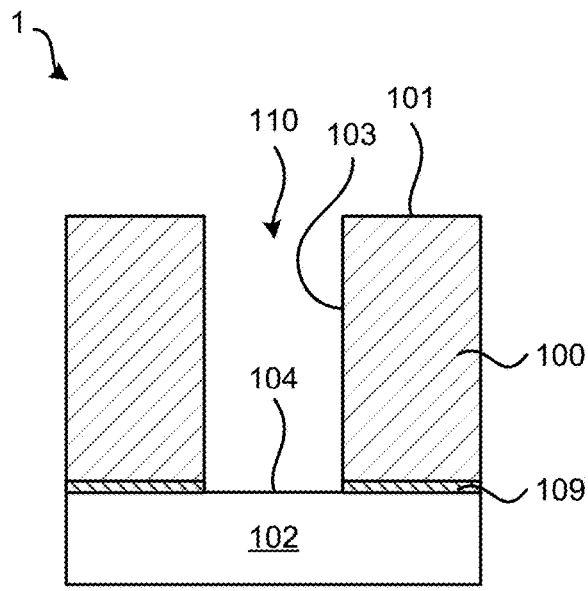
FIGS. 1A-1D schematically show a method for metal formation in a recessed feature according to an embodiment of the invention.

Embodiments of the invention describe a method for depositing a low-resistivity metal in recessed features of a semiconductor device. The recessed features can include simple and complex features found in semiconductor devices, for example vias, trenches, and combinations thereof. The method provides good void-free metal filling of fine recessed features that are hard to fill without forming voids in the metal filling. The method can be used to partially or fully fill the recessed features with the low-resistivity metal. The deposited low-resistivity metal can, for example, include Ru metal, Co metal, W metal, or a combination thereof. However, other metals may also be used.

FIGS. 1A-1D schematically shows a method for metal formation in a recessed feature according to an embodiment of the invention. The patterned substrate 1 contains a field area 101 around a recessed feature 110 (e.g., a via hole) formed in a first layer 100. In one example, the recessed feature 110 can be formed by anisotropic dry etching using an overlying patterned mask (not shown). The recessed feature 110 contains a sidewall 103 and a second layer 102 that has an exposed surface 104 at the bottom of the recessed feature 110. The patterned substrate 1 further includes an etch stop layer 109.

According to one embodiment, the first layer 100 includes a dielectric material and the second layer 102 includes a metal layer. The dielectric material can, for example, contain $SiO_2$, SiN, SiCO, SiCN, a low dielectric constant (low-k) material such as fluorinated silicon glass (FSG), carbon doped oxide, a polymer, a SiCOH-containing low-k material, a non-porous low-k material, a porous low-k material, a CVD low-k material, a spin-on dielectric (SOD) low-k material, or any other suitable dielectric material, including a high dielectric constant (high-k) material. In some examples, a width (critical dimension (CD)) of the recessed feature 110 can be between about 10 nm and about 100 nm, between about 10 nm and about 20 nm, between about 20 nm and about 90 nm, or between about 40 nm and about 80 nm. In some examples, the depth of the recessed feature 110 can between about 40 nm and about 200 nm, or between about 50 nm and about 150 nm. However, the method may also be used for void-free metal filling of recessed features with smaller or larger CDs. In some examples, the recessed feature 110 can have an aspect ratio (depth/width) between about 2 and about 20, or between about 4 and about 6. The second layer 102 can include a low-resistivity metal such as Cu metal, Ru metal, Co metal, W metal, or a combination thereof. In one example, the second layer 102 can include two or more stacked metal layers. Examples of the stacked metal layers include Co metal on Cu metal (Co/Cu) and Ru metal on Cu metal (Ru/Cu). In one example, the first layer 100 contains SiO2 and the second layer 102 includes a W metal layer, a structure commonly found in a middle-of-line (MOL) region of a semiconductor device.

According to one embodiment, the method further includes a cleaning step of exposing the patterned substrate 1 to a $H_2$-containing gas to chemically reduce the exposed surface 104 of the second layer 102 and to remove any remaining etch residues from the recessed feature 110. For example, the $H_2$-containing gas can consist of $H_2$ gas, or contain $H_2$ gas and Ar gas. The cleaning step may be performed with or without plasma excitation of the $H_2$-containing gas. In one example, the cleaning step includes exposing the patterned substrate 1 to $H_2$ gas and Ar gas at a substrate temperature between about 250° C. and about 400° C., at a gas pressure between about 250 mTorr and about 7 Torr, and for a time period between about 30 seconds and about 60 seconds. In some examples, the second layer 102 contains Cu metal or W metal and the cleaning step chemically reduces $CuO_x$ or $WO_x$ surface species to the corresponding elementary metal, thereby reducing the electrical resistance in the final device.

The method further includes forming a nucleation enhancement layer on the patterned substrate 1. The nucleation enhancement layer converts otherwise poor growth surfaces on the sidewall 103 and the field area 101 of the first layer 100 into good growth surfaces for subsequent metal deposition by vapor phase deposition. This has the effect that the metal deposition proceeds effectively on both the nucleation enhancement layer and on the second layer 102 in the recessed feature 110. This allows for void-less metal filling of the recessed feature 110. The nucleation enhancement layer is thinner than conventional deposited liners of TiN and TaN, and therefore the amount of metal that can be deposited in the recessed features is greater when using the nucleation enhancement layer. Further, the absence of a liner avoids the formation of a high electrical resistance layer at the bottom of the recessed feature 110.

Figure 1B:
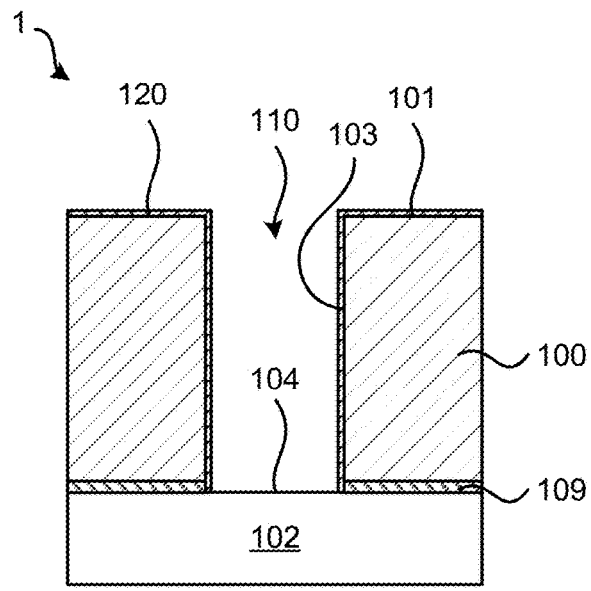

According to one embodiment, the nucleation enhancement layer is formed by first forming a nucleation blocking layer and, thereafter, converting the nucleation blocking layer into a nucleation enhancement layer. Forming the nucleation enhancement layer can include treating the patterned substrate 1 with a reactant gas that forms a nucleation blocking layer 120 on the sidewall 103 and on the field area 101 of the first layer 100. This is schematically shown in FIG. 1B. The reactant gas contains a surface modifier that has the properties of hindering deposition of the metal on first layer 100 but the second layer 102 is not modified.

According to one embodiment, the reactant gas contains a molecule that is capable of forming a self-assembled monolayer (SAM) on a substrate. SAMs are molecular assemblies that are formed spontaneously on substrate surfaces by adsorption and are organized into more or less large ordered domains. A SAM can include a molecule that possesses a head group, a tail group, and a functional end group, and a SAM is created by the chemisorption of head groups onto the substrate from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate. According to one embodiment, the head group of the molecule forming the SAM can include a thiol, a silane, or a phosphonate. Examples of silanes include molecules that include C, H, Cl, F, and Si atoms, or C, H, Cl, and Si atoms. Non-limiting examples of the molecule include perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl (chloro)dimethylsilane (($CH_3)_3CSi(CH_3)_2Cl$)).

According to some embodiments of the invention, the reactant gas can contain a silicon-containing gas, including an alkyl amine silane, an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof. According to some embodiments of the invention, the reactant gas may be selected from dimethylsilane dimethylamine (DMSDMA), trimethylsilane dimethylamine (TMSDMA), bis(dimethylamino) dimethylsilane (BDMADMS), and other alkyl amine silanes. According to other embodiments, the reactant gas may be selected from N,O bistrimethylsilyltrifluoroacetamide (BSTFA) and trimethylsilyl-pyrrole (TMS-pyrrole).

According to some embodiments of the invention, the reactant gas may contain a silazane compound. Silazanes are saturated silicon-nitrogen hydrides. They are analogous in structure to siloxanes with —NH— replacing —O—. An organic silazane precursor can further contain at least one alkyl group bonded to the Si atom(s). The alkyl group can, for example, be a methyl group, an ethyl group, a propyl group, or a butyl group, or combinations thereof. Furthermore, the alkyl group can be a cyclic hydrocarbon group such as a phenyl group. In addition, the alkyl group can be a vinyl group. Disilazanes are compounds having from one to six methyl groups attached to the silicon atoms or having one to six ethyl groups attached the silicon atoms, or a disilazane molecule having a combination of methyl and ethyl groups attached to the silicon atoms. Examples of disilazanes include hexamethyldisilazane (HMDS) and trimethyldisilazane (TMDS).

In one example, the first layer 100 contains a $SiO_2$ layer and a reactant gas containing TMSDMA reacts with hydrophilic hydroxyl groups (—OH) on the $SiO_2$ layer to form a nucleation blocking layer 120 containing hydrophobic —$SiMe_3$ groups on the $SiO_2$ layer.

The method further includes treating the patterned substrate 1 with a plasma-excited $H_2$ gas that modifies the nucleation blocking layer 120. In one example, the $H_2$ gas can further include Ar gas. It is speculated that, in the case of —$SiMe_3$ groups on a $SiO_2$ layer, the exposure to the plasma-excited $H_2$ gas removes one or more of the Me groups, thereby creating new adsorption sites near or at the —$SiMe_x$ groups (x<3).

Thereafter, the method further includes treating the patterned substrate 1 with $H_2O$ vapor that adds hydroxyl groups (—OH) to the modified nucleation blocking layer. This creates a nucleation enhancement layer 122 that schematically shown in FIG. 1C. In one example, the $H_2O$ vapor exposure may be performed at a substrate temperature of about 160° C. In the case of —SiMe$_x$ groups on a $SiO_2$ layer, the exposure to the $H_2O$ vapor is thought to form —SiCOH or —SiCOOH surface species on the $SiO_2$ layer.

After the $H_2O$ vapor exposure, a H*-radical cleaning step may optionally be performed to remove residual $H_2O$ from the patterned substrate 1 and the process chamber. In one example, the cleaning step may be performed at a substrate temperature of about 400° C.

Referring back to FIGS. 1B and 1C, according to another embodiment, the nucleation enhancement layer 122 may be formed by treating the nucleation blocking layer 120 with a plasma-excited nitrogen-containing gas that modifies the sidewall 103 of the first layer 100 in the recessed feature 110. Non-limiting examples of the nitrogen-containing gas include $NH_3$ gas, $N_2$ gas, or $N_2$ gas and $H_2$ gas. The nitrogen-containing gas may further includes a chemically inert gas such as Ar.

After forming the nucleation enhancement layer 122, the method further includes depositing a metal layer 106 in the recessed feature 110 by vapor phase deposition, where the metal layer 106 is deposited on the second layer 102 and on the nucleation enhancement layer 122. According to one embodiment, as schematically shown in FIG. 1D, the recessed feature 110 may be fully filled without voids by the metal layer 106. In one example, the metal overburden on the field area 101 may be removed by etching or chemical mechanical polishing (CMP).

The metal layer 106 can, for example, be selected from the group consisting of Ru metal, Co metal, and W metal. According to one embodiment of the invention, Ru metal may be deposited by CVD or atomic layer deposition (ALD). Examples of Ru-containing precursors include triruthenium dodecacarbonyl ($Ru_3(CO)_{12}$), (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), 4-dimethylpentadienyl) (methylcyclopentadienyl) ruthenium (Ru(DMPD)(MeCp)), and bis(ethylcyclopentadienyl) ruthenium (Ru(EtCp)$_2$), as well as combinations of these and other Ru precursors.

In one example, Ru metal may be deposited by CVD using a $Ru_3(CO)_{12}$ precursor in a CO carrier gas at a substrate temperature between about 120° C. and about 250° C., a gas pressure between about 5 mTorr and about 500 mTorr, and a gas exposure time between about 100 seconds and about 1000 seconds.

Figure 5:
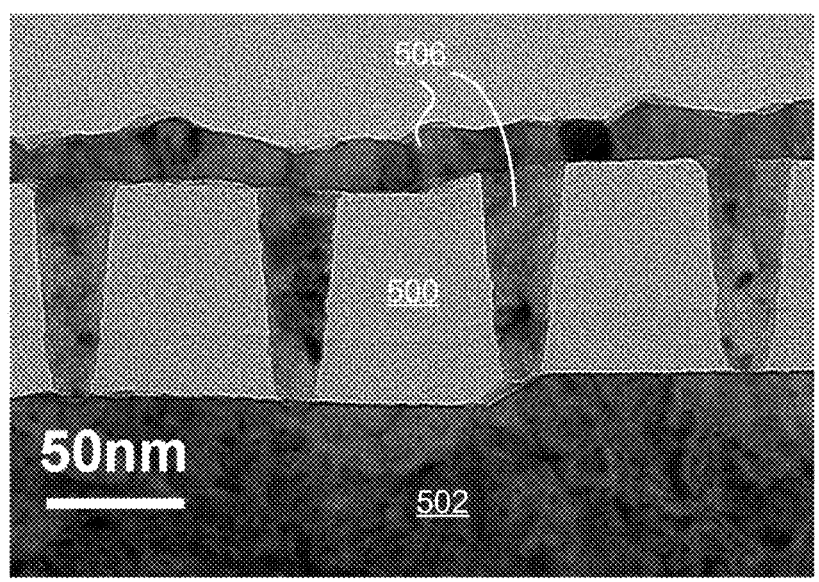
FIG. 5 shows a transmission electron microscope (TEM) image of Ru metal fill of a recessed feature according to an embodiment of the invention.

FIG. 5 shows a TEM image of a Ru metal fill of a recessed feature according to an embodiment of the invention. The recessed features were formed in a dielectric material 500 and had a width of about 24.7 nm near the top and a width of about 11.5 nm near the bottom above a metal layer 502. A reactant gas containing TMSDMA was used to form a nucleation blocking layer on the sidewall and on the field area, and a nucleation enhancement layer was formed by exposing the nucleation blocking layer to a plasma-excited $H_2$ gas, followed by a $H_2O$ vapor exposure. The Ru metal 506 was deposited by CVD using a $Ru_3(CO)_{12}$ precursor in a CO carrier gas at a substrate temperature of about 155° C., a gas pressure of about 20 mTorr, and a gas exposure time of about 600 seconds.

FIGS. 2A-2E schematically show a method for metal formation in a recessed feature according to an embodiment of the invention. The patterned substrate 1 from FIG. 1B has been reproduced as a patterned substrate 2 in FIG. 2A. The patterned substrate 2 contains the nucleation blocking layer 120 on the sidewall 103 and on the field area 101 of the first layer 100.

Figure 2A:
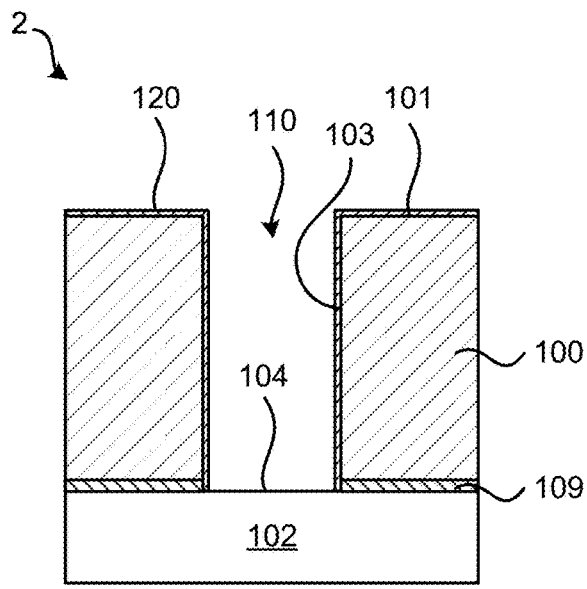
FIGS. 2A-2E schematically show a method for metal formation in a recessed feature according to an embodiment of the invention.
Figure 2B:
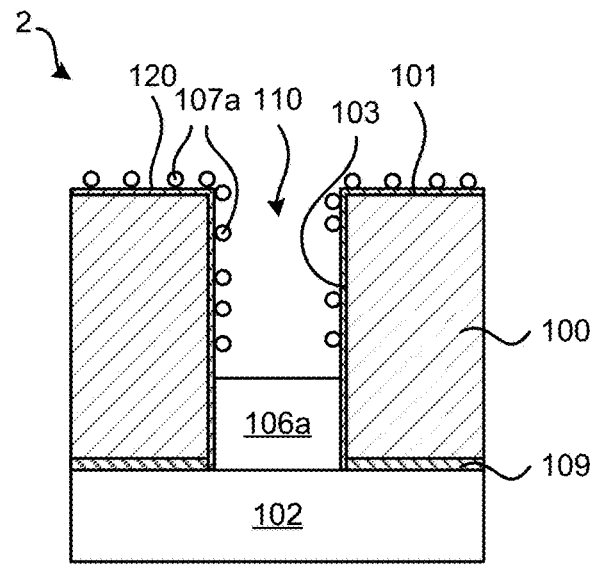

The method includes depositing an initial metal layer 106a on the patterned substrate 2 by vapor phase deposition, where the initial metal layer 106a is preferentially deposited on the second layer 102 in the recessed feature 110, and where the initial metal layer 106a less than fully fills the recessed feature 110. As schematically shown in FIG. 2B, the metal deposition may not be completely selective to the second layer 102 and metal nuclei 107a may be deposited on the sidewall 103 and on the field area 101. The deposition of the metal nuclei 107a is time delayed compared to on the second layer 102 due to lack of suitable nucleation sites on the sidewall 103 and on the field area 101. Unlike the initial metal layer 106a, the metal nuclei 107a may be form a non-continuous layer where the total amount of the deposited metal in the metal nuclei 107a is less than the amount of the metal in the initial metal layer 106a. According to one embodiment, the metal deposition may be stopped before metal nuclei 107a form on the sidewall 103 and on the field area 101.

Figure 2C:
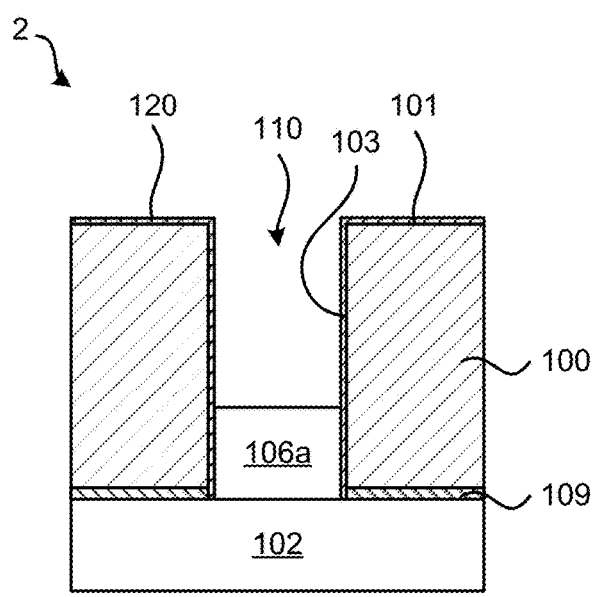

The method further includes removing the metal nuclei 107a from the patterned substrate 2 to selectively form the initial metal layer 106a on the second layer 102 in the recessed feature 110. This is schematically shown in FIG. 2C. It may be preferable to pause the metal deposition and perform the removal of the metal nuclei 107a before they get too big and are more difficult to remove efficiently. In one example, Ru metal nuclei 107a were removed by etching using an etching gas containing ozone ($O_3$) and a carrier gas. Analysis of the patterned substrate 2 following the exposure to the etching gas containing $O_3$ showed little or no damage to the dielectric material of the first layer 100. The etching gas containing $O_3$ may be generated by plasma excitation in the process chamber containing the patterned substrate 2, or the etching gas containing $O_3$ may be generated remotely using an ozone generator and the O3 flowed into the process chamber where it is exposed to the patterned substrate 2.

Thereafter, a heat-treating step may be performed that includes exposing the patterned substrate 2 to a $H_2$-containing gas to chemically reduce the exposed surface of the initial metal layer 106a following the exposure to the etching gas to remove the metal nuclei 107a. For example, the $H_2$-containing gas can consist of $H_2$ gas, or contain $H_2$ gas and Ar gas. The optional heat-treating step may be performed with or without plasma excitation of the $H_2$-containing gas. In one example, the heat-treating includes exposing the patterned substrate 2 to $H_2$ gas and Ar gas at a substrate temperature between about 300° C. and about 350° C., at a gas pressure between about 250 mTorr and about 7 Torr, and for a time period between about 30 seconds and about 60 seconds. In one example, the initial metal layer 106a contains Ru metal and the optional second heat-treating step chemically reduces any $RuO_x$ surface species to the corresponding Ru elementary metal.

According to one embodiment, the steps of depositing the initial metal layer 106a and the metal nuclei 107a, and removing the metal nuclei 107a may be repeated at least once to increase a thickness of the initial metal layer 106a in the recessed feature 110.

Figure 2D:
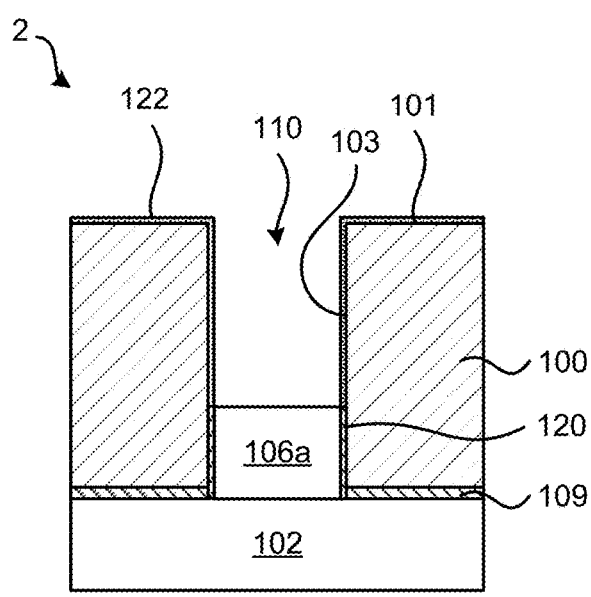
Figure 2E:
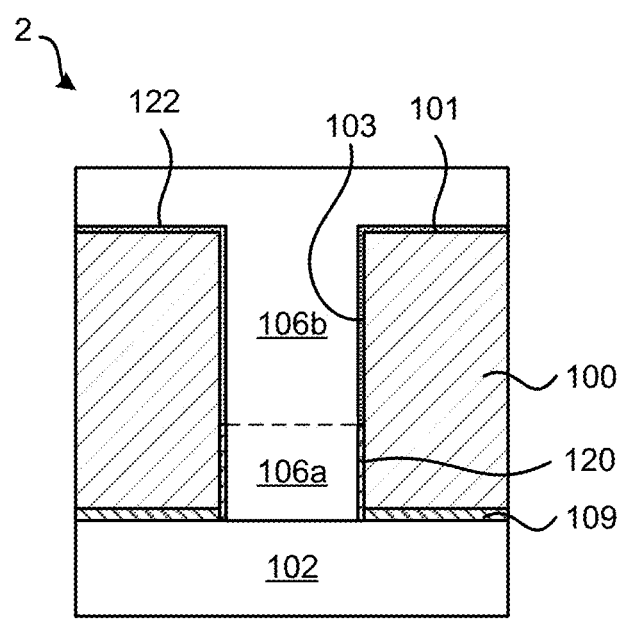

The method further includes treating the patterned substrate 2 with a plasma-excited $H_2$ gas that modifies the nucleation blocking layer 120 on the sidewall 103 above the initial metal layer 106a in the recessed feature 110. In one example, the $H_2$ gas can further include Ar gas. Thereafter, the method further includes treating the patterned substrate 2 with $H_2O$ vapor that adds hydroxyl groups (—OH) to the modified nucleation blocking layer. This creates the nucleation enhancement layer 122 above the initial metal layer 106a in the recessed feature 110. This is schematically shown in FIG. 2D. In the case of —SiMe$_x$ groups on a $SiO_2$ layer, the exposure to the $H_2O$ vapor is thought to form —SiCOH or —SiCOOH species on the $SiO_2$ layer.

After the $H_2O$ vapor exposure, a H*-radical cleaning step may be performed to remove residual $H_2O$ from the patterned substrate 2 and the process chamber. In one example, the cleaning step may be performed at a substrate temperature of about 400° C.

The method further includes, depositing a metal layer 106b in the recessed feature 110 by vapor phase deposition, where the metal layer 106b is deposited on the initial metal layer 106a and on the nucleation enhancement layer 122 on the sidewall 103. According to one embodiment, shown in FIG. 2E, the recessed feature 110 may be fully filled by the metal layers 106a and 106b. In one example, the metal overburden may be removed by etching or CMP.

The method described in FIGS. 2A-2E may provide improved void-less metal filling of narrow high-aspect ratio recessed features than the method described in FIGS. 1A-1D. This is due to the fact that the nucleation enhancement layer 122 in FIG. 2D is formed on the sidewall surfaces 103 after a portion of the volume of the recessed feature 110 has already been filled with a metal layer 106a, thereby reducing the amount of additional metal needed and reducing the likelihood of voids when fully filling the recessed feature 110.

FIGS. 3A-3F schematically shows a method for metal formation in a recessed feature according to another embodiment of the invention. The patterned substrate 3 is similar to the patterned substrate 1 in FIG. 1A but contains a dual damascene structure that includes a field area 301 around a recessed feature 314 that includes recessed features 310 (e.g., a via) and 312 (e.g., a trench) formed in a first layer 300. The recessed feature 312 contains a sidewall 303 and a bottom 313, and the recessed feature 310 contains a sidewall 305 and a second layer 302 with an exposed surface 304. The patterned substrate 3 further includes an etch stop layer 309. In one example, the first layer 300 contains a low-k material and the second layer 302 includes a Cu metal layer. This structure commonly found in back-end-of-line (BEOL) regions of a semiconductor device.

The method can further include a cleaning step that includes exposing the patterned substrate 3 to a $H_2$-containing gas to chemically reduce the exposed surface 304 of the second layer 302. For example, the $H_2$-containing gas can consist of $H_2$ gas, or contain $H_2$ gas and Ar gas. The cleaning step may be performed with or without plasma excitation of the $H_2$-containing gas. In one example, the cleaning includes exposing the patterned substrate 3 to $H_2$ gas and Ar gas at a substrate temperature between about 250° C. and about 400° C., at a gas pressure between about 250 mTorr and about 7 Torr, and for a time period between about 30 seconds and about 60 seconds. In some examples, the second layer 302 contains Cu metal or W metal and the cleaning step chemically reduces $CuO_x$ or $WO_x$ surface species to the corresponding elementary metal and as a result reduces the electrical resistance in the final device.

Figure 3A:
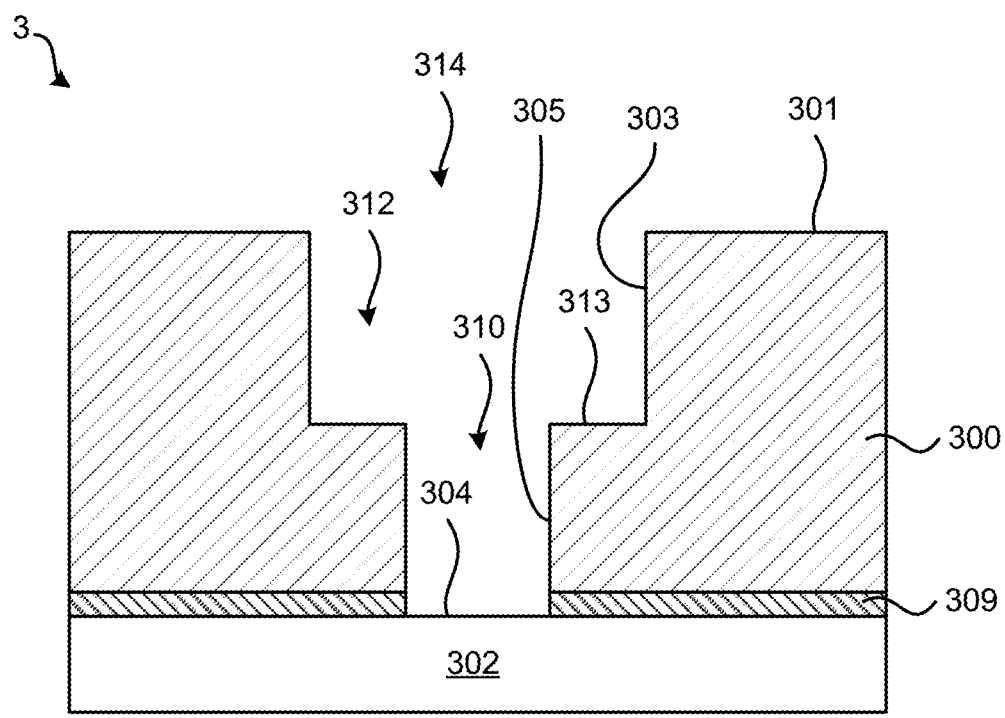
FIGS. 3A-3F schematically show a method for metal formation in a recessed feature according to an embodiment of the invention.
Figure 3B:
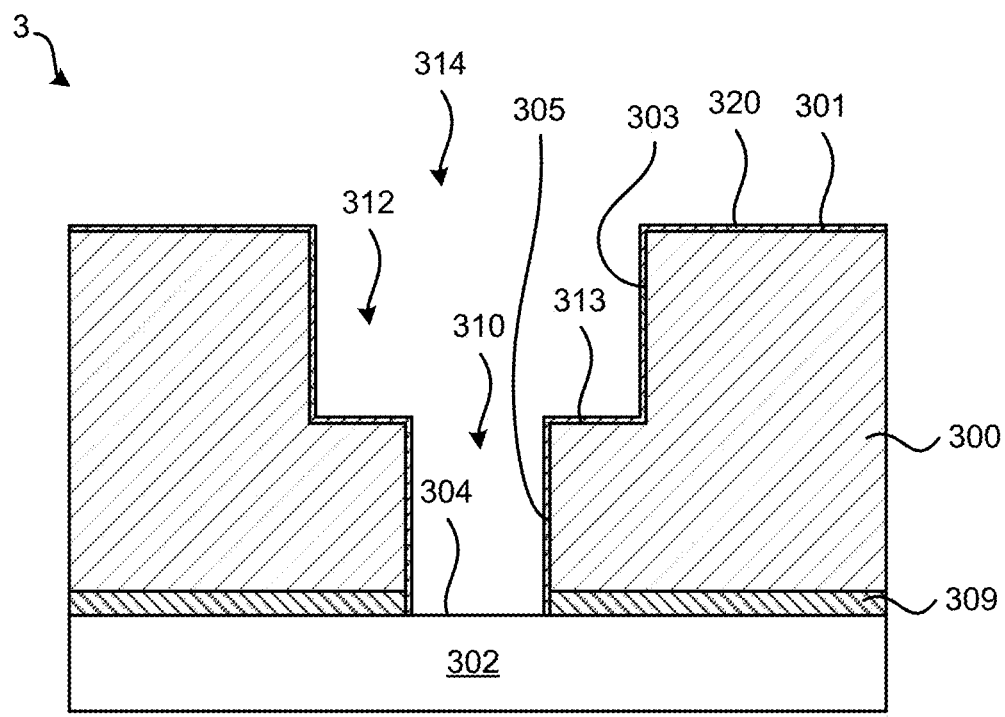

The method further includes treating the patterned substrate 3 with a reactant gas that forms a nucleation blocking layer 320 on the sidewalls 303 and 305, the bottom 313, and on the field area 301 of the first layer 300. This is schematically shown in FIG. 3B. The formation of a nucleation blocking layer is described above in reference to FIG. 1B.

Figure 3C:
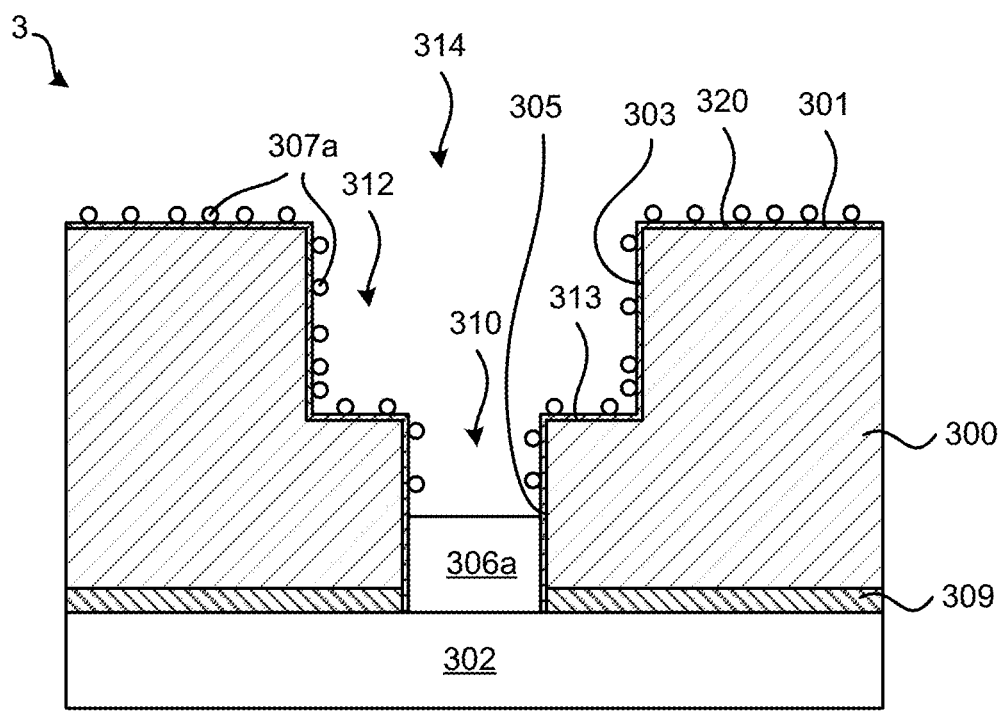

The method further includes depositing an initial metal layer 306a on the patterned substrate 3 by vapor phase deposition, where the initial metal layer 306a is preferentially deposited on the second layer 302 in the recessed feature 310. As schematically shown in FIG. 3C, the metal deposition may not be completely selective and metal nuclei 307a may be deposited on the sidewalls 303 and 305, on the bottom 313, and on the field area 301. Unlike the initial metal layer 306a, the metal nuclei 307a may be form a non-continuous layer where the total amount of the metal in the metal nuclei 307a is less than the amount of the metal in the initial metal layer 306a.

Figure 3D:
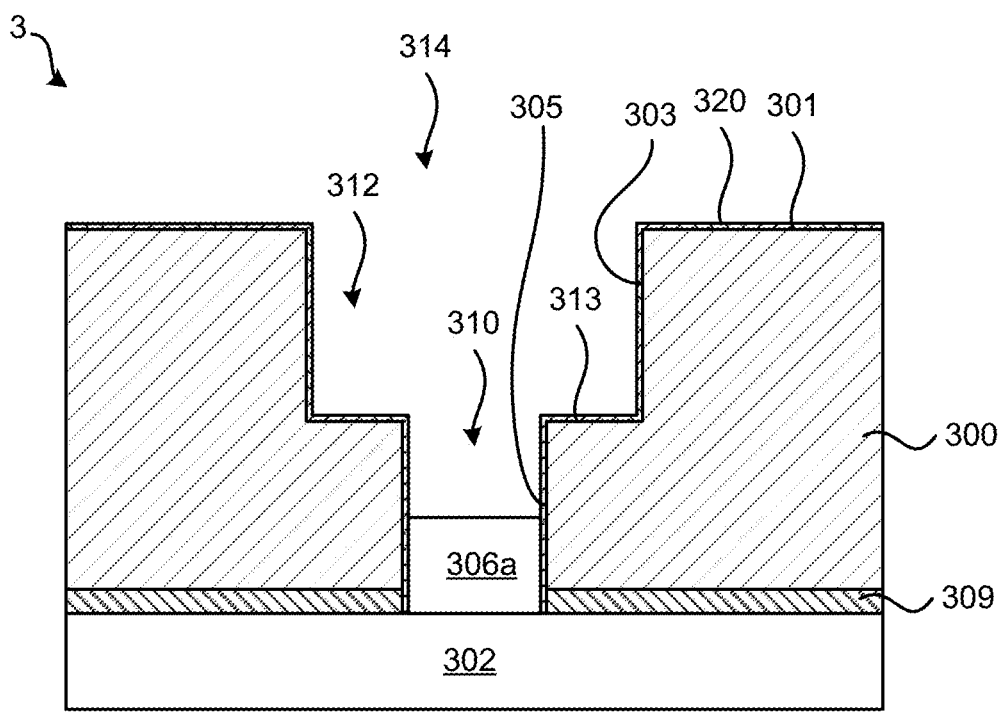

The method further includes removing the metal nuclei 307a from the patterned substrate 3 to selectively form the initial metal layer 306a on the second layer 302 in the recessed feature 310. This is schematically shown in FIG. 3D. It may be preferable to pause the metal deposition and perform the removal of the metal nuclei 307a before they get too big and are more difficult to remove efficiently. In one example, Ru metal nuclei 307a were removed by etching using an etching gas containing ozone ($O_3$) and a carrier gas. The etching gas containing $O_3$ may be generated by plasma excitation in the process chamber containing the patterned substrate 3, or the etching gas containing $O_3$ may be generated remotely using an ozone generator and flowed into the process chamber where it is exposed to the patterned substrate 3.

Thereafter, a heat-treating step may be performed that includes exposing the patterned substrate 3 to a $H_2$-containing gas to chemically reduce the exposed surface of the initial metal layer 306a following the exposure to the etching gas to move the metal nuclei 307a. For example, the $H_2$-containing gas can consist of $H_2$ gas, or contain $H_2$ gas and Ar gas. The optional heat-treating step may be performed with or without plasma excitation of the $H_2$-containing gas. In one example, the cleaning includes exposing the patterned substrate 3 to $H_2$ gas and Ar gas at a substrate temperature between about 300° C. and about 350° C., at a gas pressure between about 250 mTorr and about 7 Torr, and for a time period between about 30 seconds and about 60 seconds. In one example, the initial metal layer 306a contains Ru metal and the optional second heat-treating step chemically reduces any $RuO_x$ surface species to the corresponding Ru elementary metal.

According to one embodiment, the steps of depositing a metal layer and removing the metal nuclei may be repeated at least once to increase a thickness of the initial metal layer 306a in the recessed feature 310. In one example, the steps of depositing a metal layer and removing the metal nuclei may be repeated until the recessed feature 310 is fully filled.

Figure 3E:
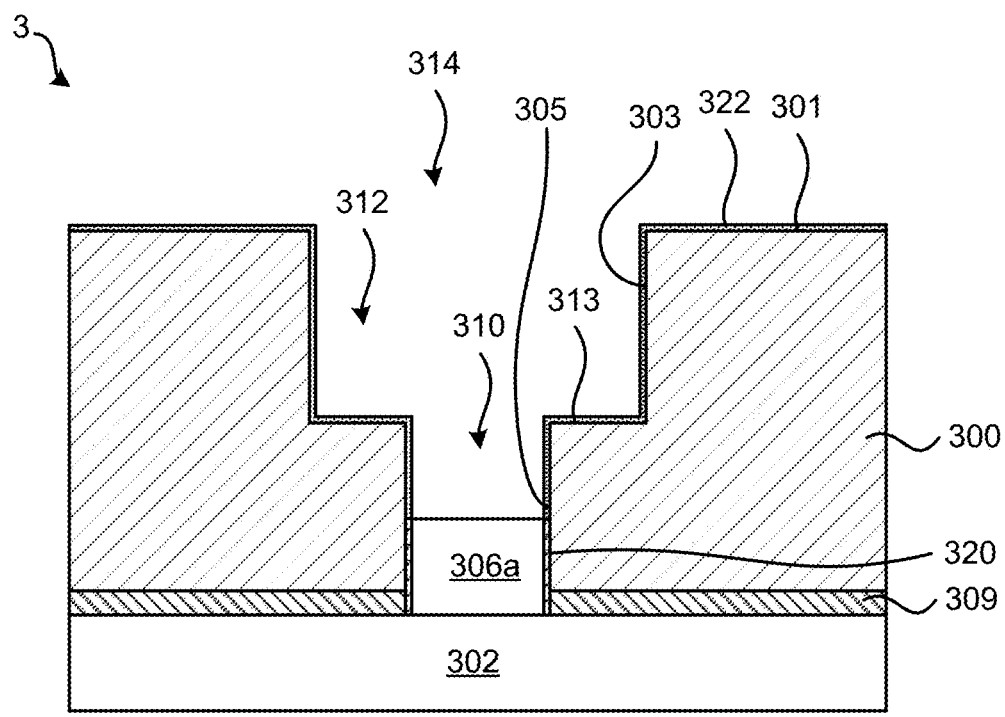
Figure 3F:
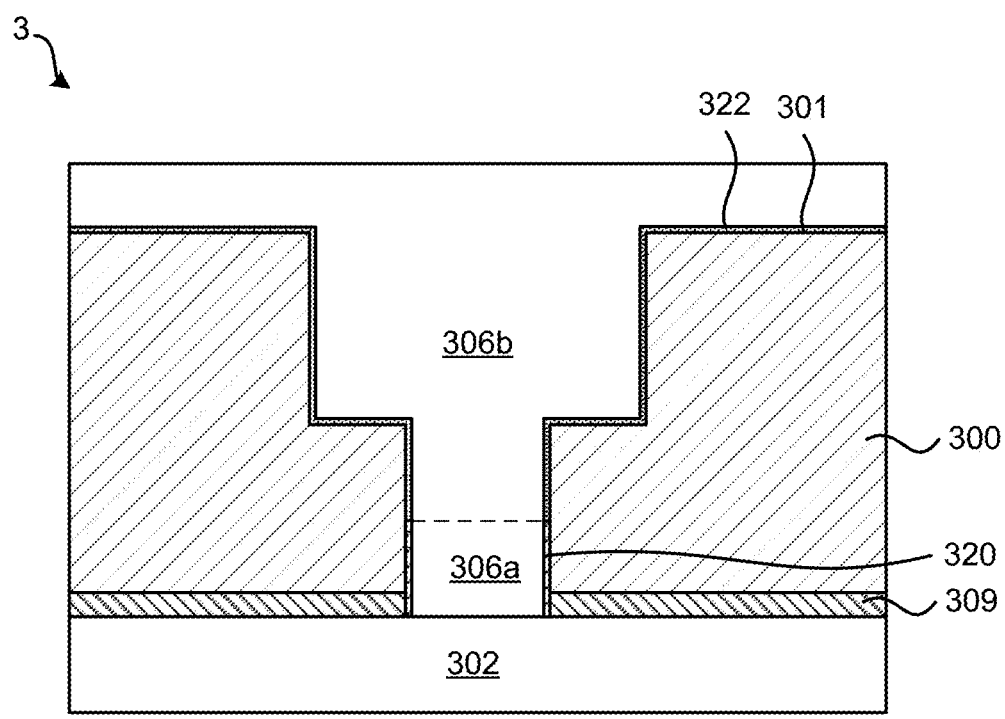

The method further includes treating the patterned substrate 3 with a plasma-excited $H_2$ gas that modifies the nucleation blocking layer 320 on the sidewall 305 above the initial metal layer 306a in the recessed feature 310, on the sidewall 303 and on the bottom 313 in the recessed feature 312, and on the field area 301. Thereafter, the method further includes treating the patterned substrate 3 with $H_2O$ vapor that adds hydroxyl groups (—OH) to the modified nucleation blocking layer. This creates a nucleation enhancement layer 322 above the initial metal layer 306a as schematically shown in FIG. 3E. In the case of —SiMe$_x$ groups on a $SiO_2$ layer, the exposure to the $H_2O$ vapor is thought to form—SiCOH or —SiCOOH species.

After the $H_2O$ vapor exposure, a H*-radical cleaning step may be performed to remove residual $H_2O$ from the patterned substrate 3 and the process chamber. In one example, the cleaning step may be performed at a substrate temperature of about 400° C.

The method further includes, depositing a metal layer 306b in the recessed feature 310 by vapor phase deposition, where the metal layer 306b is deposited on the initial metal layer 306a and on the nucleation enhancement layer 322. According to one embodiment, shown in FIG. 3F, the recessed features 310 and 312 may be fully filled with the metal layers 306a and 306b. In one example, the metal overburden may be removed by etching or CMP.

Figure 4A:
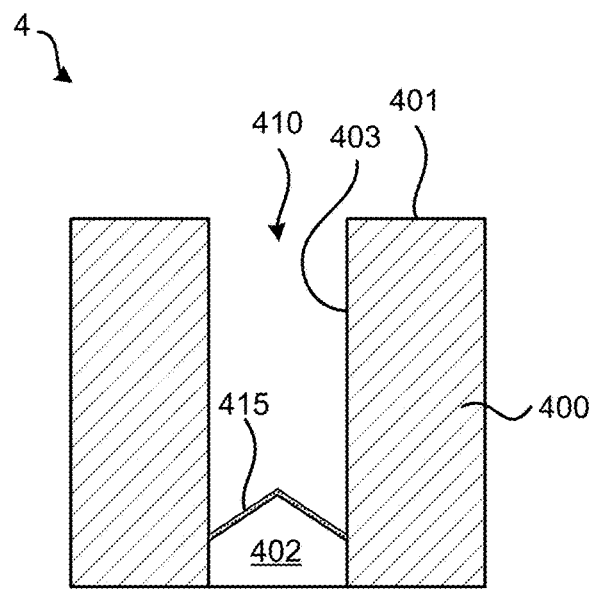
FIGS. 4A-4F schematically show a method for metal formation in a recessed feature according to an embodiment of the invention.

FIGS. 4A-4F schematically shows a method for metal formation in a recessed feature according to another embodiment of the invention. In FIG. 4A, the patterned substrate 4 includes a field area 401 around a recessed feature 410 formed in a first layer 400. The recessed feature 410 contains a sidewall 403 and a second layer 402 at the bottom of the recessed feature 410. The second layer 402 contains an oxide layer 415 thereon. In one example, the first layer 400 contains a low-k material, the second layer 402 includes an epitaxial Si or SiGe layer, and the oxide layer 415 includes $SiO_x$ or $SiGeO_x$.

Figure 4B:
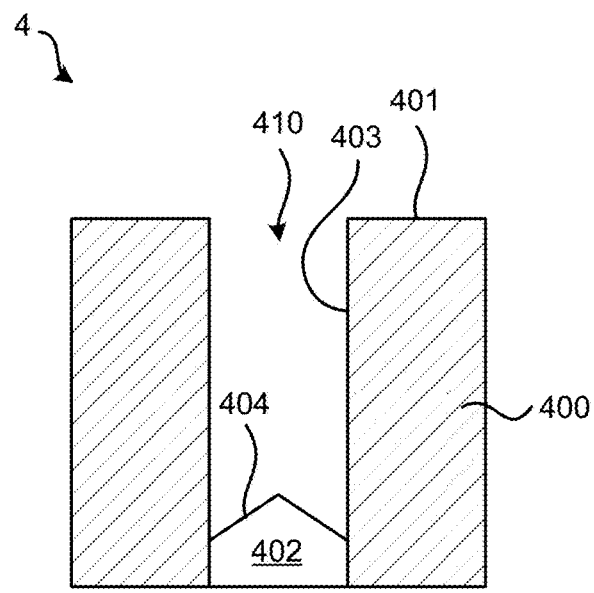

The method includes a cleaning step that includes performing a chemical oxide removal (COR) that removes the oxide layer 415. The oxide removal creates a clean surface 404 on the second layer 402 as schematically shown in FIG. 4B. In one example, the COR includes gaseous exposures of $NH_3$ and HF, followed by a heat-treatment that removes volatile reaction by-products from the patterned substrate 4.

Figure 4C:
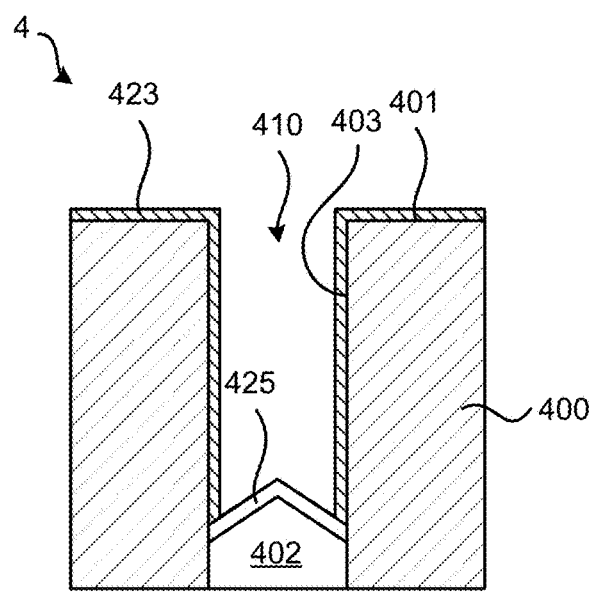

The method further includes conformally depositing a contact metal on the patterned substrate 4. For example, the contact metal can include titanium (Ti) metal or cobalt (Co) metal. In the example of Ti metal, the Ti metal reacts with oxygen on the surfaces of the first layer 400 to form a $TiO_x$ layer 423 on the sidewall 403 and on the field area 401, but a Ti metal layer 425 is deposited on the clean surface 404. This is schematically shown in FIG. 4C. In one example, the Ti metal layer may be deposited by plasma-enhanced CVD.

Figure 4D:
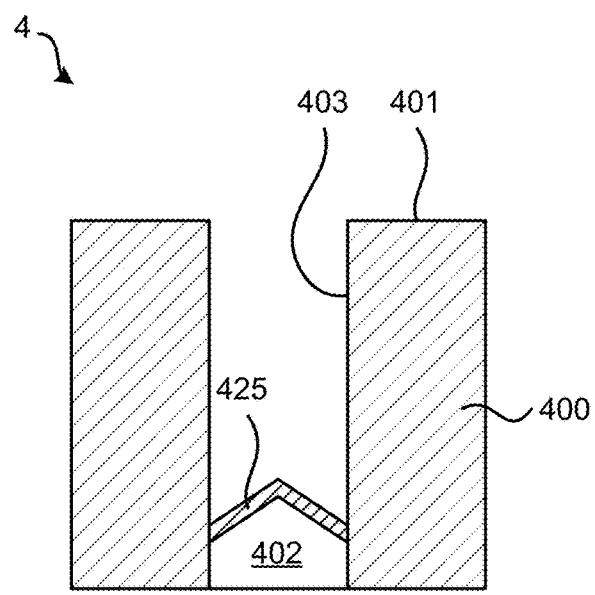
Figure 4E:
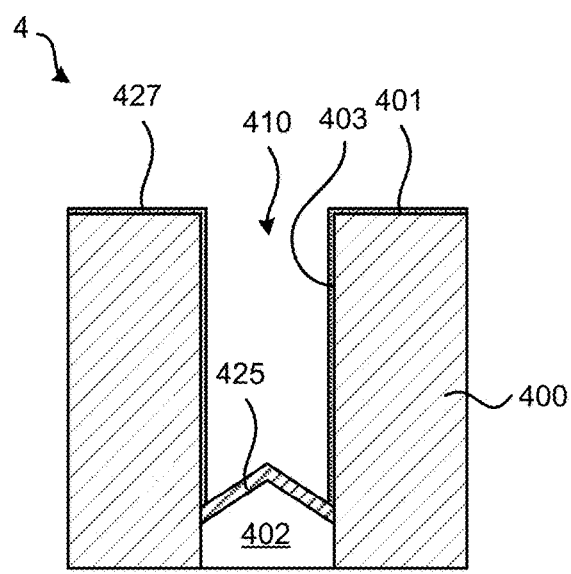

Thereafter, the method further includes selectively removing the $TiO_x$ layer 423 from the sidewall 403 and the field area 401 by a dry etching process. This is schematically shown in FIG. 4D.

Thereafter, a nucleation enhancement layer 427 is formed by treating the patterned substrate 4 with a plasma-excited nitrogen-containing gas that modifies the sidewall 403 and the field area 401. Non-limiting examples of the nitrogen-containing gas include $NH_3$ gas, $N_2$ gas, or $N_2$ gas and $H_2$ gas. The nitrogen-containing gas may further includes a chemically inert gas such as Ar.

Figure 1C:
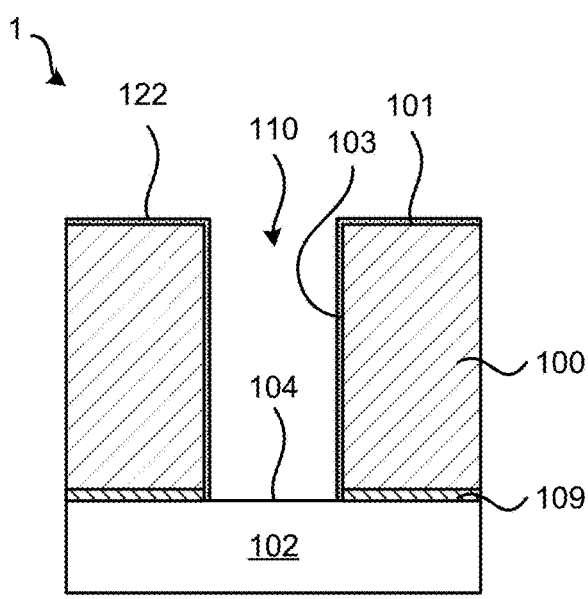
Figure 1D:
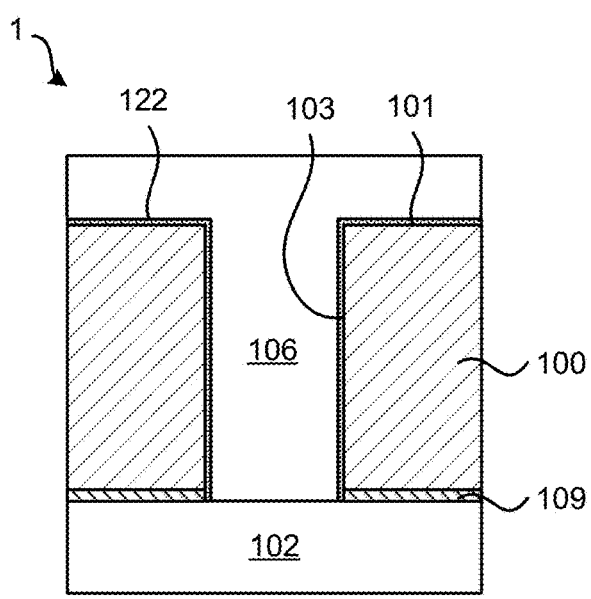

According to another embodiment, the nucleation enhancement layer 427 may be formed as described above in reference to the nucleation enhancement layer 122 in FIG. 1C.

Figure 4F:
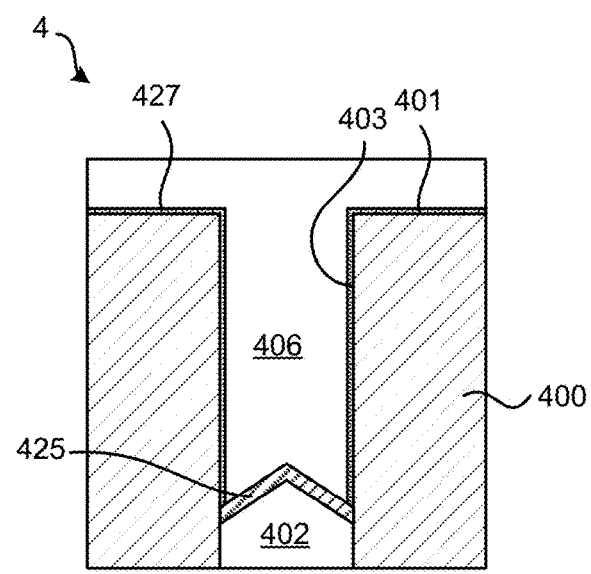

The method further includes depositing a metal layer 406 in the recessed feature 410 by vapor phase deposition, where the metal layer 406 is deposited on the Ti metal layer 425 and on the nucleation enhancement layer 427. According to one embodiment, as schematically shown in FIG. 4F, the recessed feature 410 may be fully filled without voids by the metal layer 406. In one example, the metal overburden may be removed by etching or CMP.

A method for filling recessed features in semiconductor devices with a low-resistivity metal has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
   providing a patterned substrate containing a recessed feature formed in a first layer and a second layer that is exposed in the recessed feature;
   forming a nucleation enhancement layer on a sidewall of the first layer in the recessed feature but not on the second layer, wherein forming the nucleation enhancement layer includes forming a nucleation blocking layer on the sidewall, and converting the nucleation blocking layer into the nucleation enhancement layer; and
   depositing a metal layer in the recessed feature by vapor phase deposition, wherein the metal layer is deposited on the second layer and on the nucleation enhancement layer, wherein forming the nucleation enhancement layer comprises:
   exposing the patterned substrate to a reactant gas that forms the nucleation blocking layer on the sidewall;
   treating the patterned substrate with a plasma-excited $H_2$ gas that modifies the nucleation blocking layer; and
   adding hydroxyl groups to the modified nucleation blocking layer.

2. The method of claim 1, wherein adding the hydroxyl groups to the modified nucleation blocking layer includes exposing the patterned substrate to $H_2O$ vapor.

3. The method of claim 1, wherein the nucleation blocking layer includes a self-assembled monolayer (SAM).

4. The method of claim 1, wherein the reactant gas contains an alkyl amine silane, an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or a combination thereof.

5. The method of claim 1, wherein the first layer includes a dielectric material and the second layer includes a metal.

6. The method of claim 1, wherein the recessed feature includes a via hole and a trench above the via hole, and wherein the metal layer fills less than the entire via hole.

7. The method of claim 1, wherein the second layer is selected from the group consisting of Ru metal, Co metal, and W metal, and the metal layer is selected from the group consisting of Cu metal, Ru metal, Co metal, W metal, and a combination thereof.

8. A method of forming a semiconductor device, the method comprising:
   providing a patterned substrate containing a recessed feature formed in a first layer and a second layer that is exposed in the recessed feature;
   selectively forming an initial metal layer on the second layer in the recessed feature;
   thereafter, forming a nucleation enhancement layer on a sidewall of the first layer in the recessed feature but not on the second layer, wherein forming the nucleation enhancement layer includes forming a nucleation blocking layer on the sidewall, and converting the nucleation blocking layer into the nucleation enhancement layer; and depositing a metal layer in the recessed feature by vapor phase deposition, wherein the metal layer is deposited on the initial metal layer and on the nucleation enhancement layer, wherein forming the nucleation enhancement layer comprises:

exposing the patterned substrate to a reactant gas that forms the nucleation blocking layer on the sidewall;

treating the patterned substrate with a plasma-excited $H_2$ gas that modifies the nucleation blocking layer; and adding hydroxyl groups to the modified nucleation blocking layer.

9. The method of claim 8, wherein depositing the initial metal layer further deposits metal nuclei on the sidewall of the first layer, the method further comprising removing the metal nuclei from the sidewall.

10. The method of claim 9, further comprising:
repeating depositing the metal layer and removing the metal nuclei at least once to increase a thickness of the initial metal layer in the recessed feature.

11. The method of claim 8, wherein adding the hydroxyl groups to the modified nucleation blocking layer includes exposing the patterned substrate to $H_2O$ vapor.

12. The method of claim 8, wherein the nucleation blocking layer includes a self-assembled monolayer (SAM).

13. The method of claim 8, wherein the reactant gas contains an alkyl amine silane, an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or a combination thereof.

14. The method of claim 8, wherein the first layer includes a dielectric material and the second layer includes a metal.

15. The method of claim 8, wherein the recessed feature includes a via hole and a trench above the via hole, and wherein the initial metal layer partially fills the via hole.

16. A method of forming a semiconductor device, the method comprising:

providing a patterned substrate containing a recessed feature formed in a dielectric material and a second layer that is exposed in the recessed feature;

depositing a contact metal on the dielectric material and on the second layer, wherein the contact metal reacts to form a metal oxide layer on the dielectric material;

removing the metal oxide layer from a sidewall of the dielectric material in the recessed feature;

forming a nucleation enhancement layer on the sidewall but not on the second layer, wherein forming the nucleation enhancement layer includes forming a nucleation blocking layer on the sidewall, and converting the nucleation blocking layer into the nucleation enhancement layer; and depositing a metal layer in the recessed feature by vapor phase deposition, wherein the metal layer is deposited on the contact metal and on the nucleation enhancement layer.

17. The method of claim 16, wherein the metal layer fully fills the recessed feature.

18. The method of claim 16, wherein the contact metal contains Ti or Co.

19. The method of claim 16, wherein forming the nucleation enhancement layer comprises:

exposing the patterned substrate with a reactant gas that forms the nucleation blocking layer on the sidewall; and treating the patterned substrate with a plasma-excited nitrogen-containing gas that modifies the sidewall of the dielectric material in the recessed feature.

20. The method of claim 19, wherein the nucleation blocking layer includes a self-assembled monolayer (SAM).

21. The method of claim 19, wherein the reactant gas contains an alkyl amine silane, an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or a combination thereof.

* * * * *